(12) United States Patent
Kovac et al.

(10) Patent No.: US 11,405,064 B1
(45) Date of Patent: Aug. 2, 2022

(54) BYPASS PATH REUSE AS FEEDBACK PATH IN FRONTEND MODULE

(71) Applicant: pSemi Corporation, San Diego, CA (US)

(72) Inventors: David Kovac, Arlington Heights, IL (US); Joseph Golat, Crystal Lake, IL (US)

(73) Assignee: PSEMI CORPORATION, San Diego, CA (US)

( * ) Notice: Subject to any disclaimer, the term of this patent is extended or adjusted under 35 U.S.C. 154(b) by 0 days.

(21) Appl. No.: 17/365,964

(22) Filed: Jul. 1, 2021

(51) Int. Cl.
  *H04B 1/16* (2006.01)
  *H03G 3/30* (2006.01)
  *H04B 1/18* (2006.01)
  *H03F 3/195* (2006.01)

(52) U.S. Cl.
  CPC ........... *H04B 1/1615* (2013.01); *H03F 3/195* (2013.01); *H03G 3/3036* (2013.01); *H04B 1/18* (2013.01); *H03F 2200/294* (2013.01)

(58) Field of Classification Search
  CPC ......... H04B 1/1615; H04B 1/18; H03F 3/195; H03F 2200/294; H03G 3/3036
  See application file for complete search history.

(56) References Cited

U.S. PATENT DOCUMENTS

| | | | |
|---|---|---|---|
| 9,602,098 B2 | 3/2017 | Prevost | |
| 2015/0200702 A1* | 7/2015 | Weichert | H03F 3/24 375/297 |
| 2019/0363690 A1* | 11/2019 | Golat | H03F 3/19 |

* cited by examiner

*Primary Examiner* — Nguyen T Vo
(74) *Attorney, Agent, or Firm* — Steinfl + Bruno LLP

(57) ABSTRACT

Methods and devices for processing of RF signals according to different gain modes are presented. According to one aspect, an active amplification mode is provided by switchable active paths coupled to respective input RF signals and a passive attenuation mode is provided by switchable passive paths coupled to the respective RF signals. According to another aspect, a common switchable feedback path coupled to the switchable active paths is used to provide an active attenuation mode. Coupling of the common switchable feedback path to the switchable active path is provided by switches of the switchable passive paths, including for coupling both ends of the common switchable feedback path or just one end.

21 Claims, 15 Drawing Sheets

BYPASS PATH REUSE AS FEEDBACK PATH IN FRONTEND MODULE

TECHNICAL FIELD

The present disclosure is related to electronic radio frequency (RF) circuits, and more particularly to use of active and passive RF paths for achieving different gain modes.

BACKGROUND

Processing of an RF signal through an RF system may be provided via a combination of switches that selectively route the RF signal through one or more of active or passive RF paths. When processed through an active RF path, the RF signal passes through an active device, such as, for example an amplifier (low noise amplifier LNA, power amplifier PA), which typically provides a gain that is greater than zero dB (i.e., ≥0 dB, RF amplification). When processed through a passive path, which is therefore devoid of any active device (e.g., transistors, amplifiers), the RF signal passes through passive devices or components which in combination may provide a gain that is smaller than zero dB (i.e., ≤0 dB, RF attenuation).

In some RF systems, support of various gain modes may be provided via processing of an RF signal through an active path, a passive path, or a combination of an active and a passive path. For example, FIG. 1 shows a simplified schematic of a prior art multi-input and multi-gain RF processing circuit (100) comprising an input switch $SW_{IN}$ that is configured to selectively couple one of a plurality of RF signals (e.g., $RF_{IN1}$, $RF_{IN2}$, $RF_{IN3}$, etc.) to a switchable active path ($L_{SER}$, 110, 121, 122, 123, $SW_{OA}$) or a switchable passive path ($SW_{IP}$, 141, $SW_{OP}$). A gain mode associated to a selected RF signal, $RF_{S1}$, can in turn be used to configure each of the two switchable paths for processing of the selected RF signal and provision of a corresponding output RF signal, $RF_{OUT}$.

The switchable active path ($L_{SER}$, 110, 121, 122, 123, $SW_{OA}$) of FIG. 1 may (optionally) include a series connected inductor, $L_{SER}$, that may be used for matching to an input of an amplifier (110, LNA, PA), and one or more series connected attenuators (e.g., 121, 122, 123) coupled to the output of the amplifier (110). An output switch $SW_{OA}$ of the switchable active path ($L_{SER}$, 110, 121, 122, 123, $SW_{OA}$) may be used to selectively couple/decouple an RF signal (processed) through the switchable active path to an output node (e.g., $RF_{OUT}$) of the RF processing circuit (100). The switchable passive path ($SW_{IP}$, 141, $SW_{OP}$) of FIG. 1 may include one or more series connected attenuators (e.g., 141) that may be selectively coupled to (and decoupled from) the input switch $SW_{IN}$ via an input switch $SW_{IP}$ of the switchable passive path ($SW_{IP}$, 141, $SW_{OP}$), and to the output node (e.g., $RF_{OUT}$) via an output switch $SW_{OP}$ of the switchable passive path ($SW_{IP}$, 141, $SW_{OP}$).

Processing of the selected RF signal, $RF_{S1}$, through the switchable active path ($L_{SER}$, 110, 121, 122, 123, $SW_{OA}$) may include decoupling the selected RF signal, $RF_{S1}$ from the one or more attenuators (e.g., 141) of the switchable passive path ($SW_{IP}$, 141, $SW_{OP}$) via switches ($SW_{IP}$, $SW_{OP}$). Once decoupled from the switchable passive path ($SW_{IP}$, 141, $SW_{OP}$), the selected RF signal, $RF_{S1}$, may be amplified through the amplifier (110), further adjusted/attenuated through the one or more attenuators (e.g., 121, 122, 123), and output at the output node (e.g., $RF_{OUT}$) through the output switch $SW_{OA}$ of the switchable active path.

Processing of the selected RF signal, $RF_{S1}$, through the switchable passive path ($SW_{IP}$, 141, $SW_{OP}$) may include decoupling the selected RF signal, $RF_{S1}$, from the one or more attenuators (e.g., 121, 122, 123) of the switchable active path ($L_{SER}$, 110, 121, 122, 123, $SW_{OA}$) via the switch $SW_{OA}$. Optionally, the amplifier (110) may be deactivated to further decouple the selected RF signal, $RF_{S1}$, from elements of the switchable active path. Once decoupled from the switchable active path ($L_{SER}$, 110, 121, 122, 123, $SW_{OA}$), the selected RF signal, $RF_{S1}$, may be adjusted/attenuated through the one or more attenuators (e.g., 141), and output at the output node (e.g., $RF_{OUT}$) through the output switch $SW_{OP}$ of the switchable passive path ($SW_{IP}$, 141, $SW_{OP}$).

As known to a person skilled in the art, the various attenuators (e.g., 121, 122, 123, 141) of the switchable active/passive paths described above may be configurable (e.g., programmable, controllable, settable, such as an RF stepped attenuator or a digital step attenuator) to provide different levels/steps of attenuations (e.g., gain<0 dB) as well as a passthrough/bypass mode (e.g., zero series impedance) and an isolation mode (e.g., high series impedance). Accordingly, the combination of the amplifier (110) with the cascaded (series connected) attenuators (121, 122, 123) may be configurable for providing a (programmable, configurable, settable) gain of the active path ($L_{SER}$, 110, 121, 122, 123, $SW_{OA}$) that may be as high as the highest gain setting of the amplifier (110, with attenuators in passthrough mode for a net gain≥0 dB), and as low as the lowest gain setting of the amplifier (110) combined with the highest attenuation of each of the attenuators (121, 122, 123, for a net gain<0 dB). In other words, the switchable active path ($L_{SER}$, 110, 121, 122, 123, $SW_{OA}$) allows processing of the selected RF signal, $RF_{S1}$, for provision of an amplified or an attenuated output RF signal, $RF_{OUT}$. On the other hand, the switchable passive path ($SW_{IP}$, 141, $SW_{OP}$) allows processing of the selected RF signal, $RF_{S1}$, for provision of an attenuated output RF signal, $RF_{OUT}$.

Based on the above, the multi-input and multi-gain RF processing circuit (100) may provide attenuation of any one of the inputs (e.g., $RF_{IN1}$, $RF_{IN2}$, $RF_{IN3}$) via either the switchable active path ($L_{SER}$, 110, 121, 122, 123, $SW_{OA}$) or the switchable passive path ($SW_{IP}$, 141, $SW_{OP}$). Such flexibility may be used by various system integrators in view of their respective design goals and performances, including with respect to, for example, RF isolation, parasitic loading, noise figure (NF), phase requirement, and linearity or distortion (e.g. IP3).

For example, if the multi-input and multi-gain RF processing circuit (100) of FIG. 1 is used in a receive side of an RF frontend module, since the switchable passive path ($SW_{IP}$, 141, $SW_{OP}$) does not include reverse isolation, it may provide signals (e.g., local oscillators) present in downstream circuitry (e.g., a transceiver) a path to an antenna coupled to the input switch $SW_{IN}$, thereby potentially causing undesired emission of leaked signals. Furthermore, since the switchable active path includes elements ($L_{SER}$, 110, 121, 122, 123, $SW_{OA}$) that are different from elements ($SW_{IP}$, 141, $SW_{OP}$) of the switchable passive path, such paths provide different phases to processed/received RF signals, which in turn may require RF processing (e.g., equalization) to align the phases for further processing of the RF signals via common downstream circuitry (e.g., transceiver).

In view of the above shortcomings associated with use of the switchable passive path ($SW_{IP}$, 141, $SW_{OP}$) of the configuration shown in FIG. 1, some system integrators may opt use of the switchable active path ($L_{SER}$, 110, 121, 122, 123, $SW_{OA}$) for gain modes including both amplification mode (gain≥0 dB) and attenuation mode (gain≤0 dB). However, when operating in the attenuation mode, since all or some of the attenuation is provided via one or more of the attenuators (121, 122, 123) after amplification via the amplifier (110), as known to a person skilled in the art, a lower linearity performance (e.g., IP3) may be obtained compared to a configuration wherein the attenuation is performed prior to the amplification.

The above shortcoming of the prior art configuration of FIG. 1 are a motivation to the present teachings which aim for an improved RF processing circuit via a switchable active path with increased performance during the attenuation mode of operation, while reducing a total number of switches used in the circuit. This in turn may allow reduced (parasitic switch) capacitive loading of the RF processing paths with greater advantages when bulk CMOS fabrication technologies are used.

SUMMARY

According to a first aspect of the present disclosure, a multi-input multi-gain radio frequency (RF) processing circuit is presented, comprising: a plurality of switchable active paths, each switchable active path of the plurality of switchable active paths coupled between a respective input RF node and an output RF node of the multi-input multi-gain RF processing circuit; a plurality of switchable passive paths associated to the plurality of switchable active paths, each switchable passive path of the plurality of switchable passive paths coupled between the respective input RF node and the output RF node; and a switchable feedback path, wherein the each switchable active path comprises: an amplifier comprising an amplifier input coupled to the respective input RF node, and an amplifier output coupled to a first common node that is common to the plurality of switchable active paths, and the each switchable passive path comprises: an input switch comprising an input terminal coupled to the respective input RF node, and an output terminal coupled to a second common node that is common to the plurality of switchable passive paths and to the switchable feedback path.

According to a second aspect of the present disclosure, a multi-input multi-gain radio frequency (RF) processing circuit is presented, comprising: a plurality of switchable active paths comprising respective one or more switches, each switchable active path of the plurality of switchable active paths coupled between a respective input RF node of a plurality of input RF nodes and an output RF node of the multi-input multi-gain RF processing circuit; a plurality of switchable passive paths comprising respective one or more switches, each switchable passive path of the plurality of switchable passive paths coupled between a respective input RF node of the plurality of input RF nodes and the output RF node; and a switchable feedback path, wherein during a passive attenuation mode of operation of the multi-input multi-gain RF processing circuit, the respective one or more switches of a switchable active path of the plurality of switchable active paths are configured to provide a conduction path of an RF signal coupled to the respective input RF node to the output RF node through said switchable active path, the conduction path comprising an amplifier, and the respective one or more switches of a switchable passive path of the plurality of switchable passive paths are configured to couple the switchable feedback path to said conduction path to provide a feedback conduction path between an output and an input of the amplifier According to a third aspect of the present disclosure, method for processing a plurality of input RF signals according to multiple gain modes is presented, the method comprising: coupling a plurality of switchable active paths between respective input RF nodes of a plurality of input RF nodes and an output RF node; coupling a plurality of switchable passive paths between respective input RF nodes of the plurality of input RF nodes and the output RF node; coupling an input RF signal of the plurality of input RF signals to an input RF node of the plurality of input RF nodes; for operation according to an active amplification mode, configuring a switchable active path of the plurality of switchable active paths that is coupled to the input RF node for conduction of the input RF signal through an amplifier of the switchable active path, thereby obtaining an amplified RF signal at the output RF node; for operation according to an active attenuation mode, configuring the switchable active path for conduction of the input RF signal through the amplifier of the switchable active path, and configuring a switchable passive path of the plurality of switchable passive paths that is coupled to the input RF node for coupling of a switchable feedback path between an input and an output of the amplifier of the switchable active path, thereby obtaining an attenuated RF signal at the output RF node; and for operation according to a passive attenuation mode, configuring the switchable passive path for conduction of the input RF signal through an attenuator of the switchable passive path, thereby obtaining an attenuated RF signal at the output RF node.

Further aspects of the disclosure are provided in the description, drawings and claims of the present application.

BRIEF DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

Like reference numbers and designations in the various drawings indicate like elements.

DETAILED DESCRIPTION

As used herein, the expressions "a switchable RF processing path", "a switchable RF path", or simply "a switchable path", are synonymous and may refer to an RF signal conduction path that may include active and/or passive elements and at least one switch that is configured to selectively couple/decouple the conduction path to/from a node of a circuit used to receive, process, or output, an RF signal.

As used herein, the expression "a switchable active path" may refer to a switchable path that includes at least on active device, such as, for example, an amplifier or a transistor.

As used herein, the expression "a switchable passive path" may refer to a switchable path that is devoid of any active device.

As used herein, the expression "active amplification" may refer to any processing of an RF signal via an active path, including a switchable active path, to obtain a processed RF signal with a gain that is positive (gain≥0 dB).

As used herein, the expression "active attenuation" may refer to any processing of an RF signal via an active path, including a switchable active path, to obtain a processed RF signal with a gain that is negative (gain≤0 dB).

As used herein, the expression "passive attenuation" may refer to any processing of an RF signal via a passive path, including a switchable passive path, to obtain a processed RF signal with a gain that is negative (gain≤0 dB).

Figure 1:
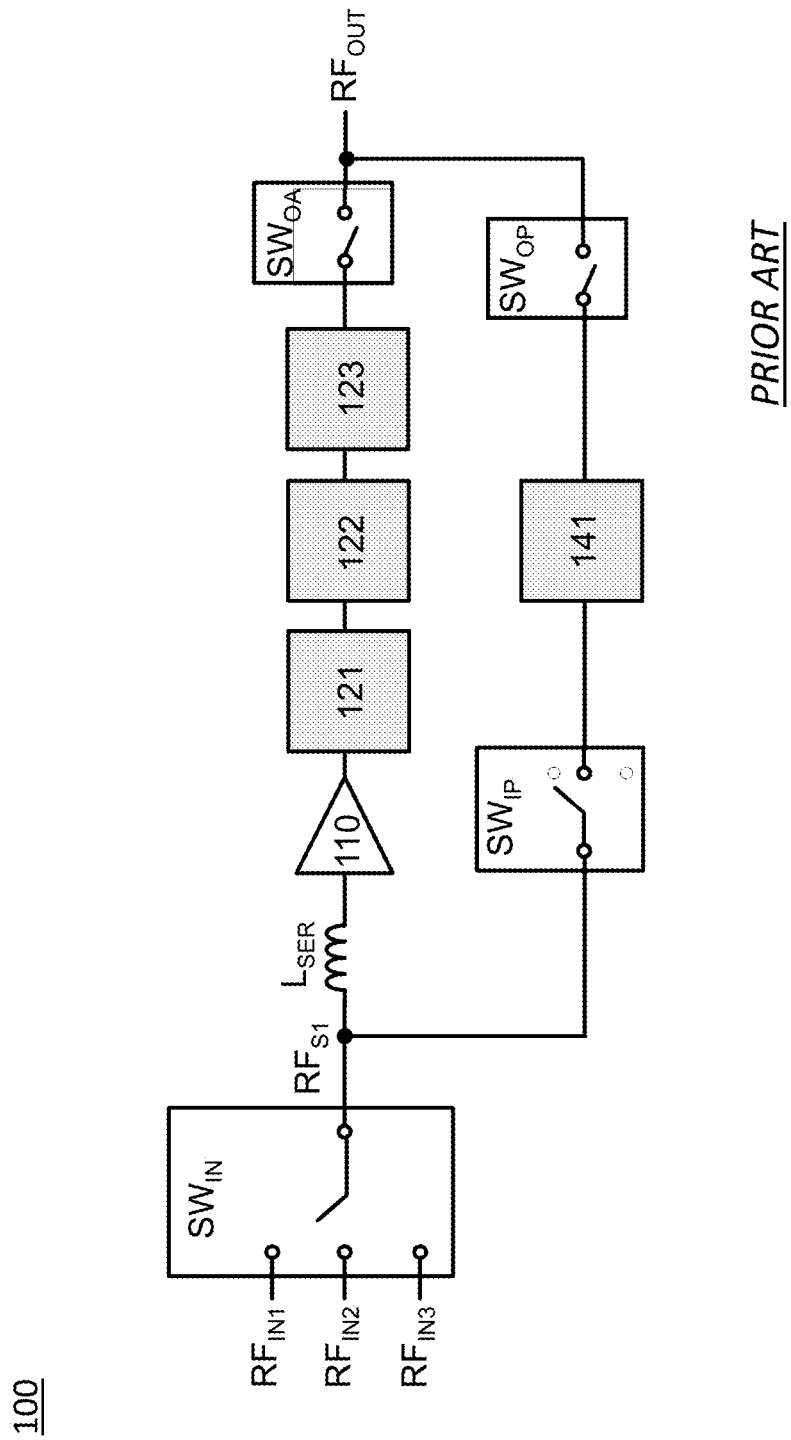
FIG. 1 shows a simplified schematic of another multi-input and multi-gain RF processing circuit comprising a switchable active path that is separate from a switchable passive path.
Figure 2:
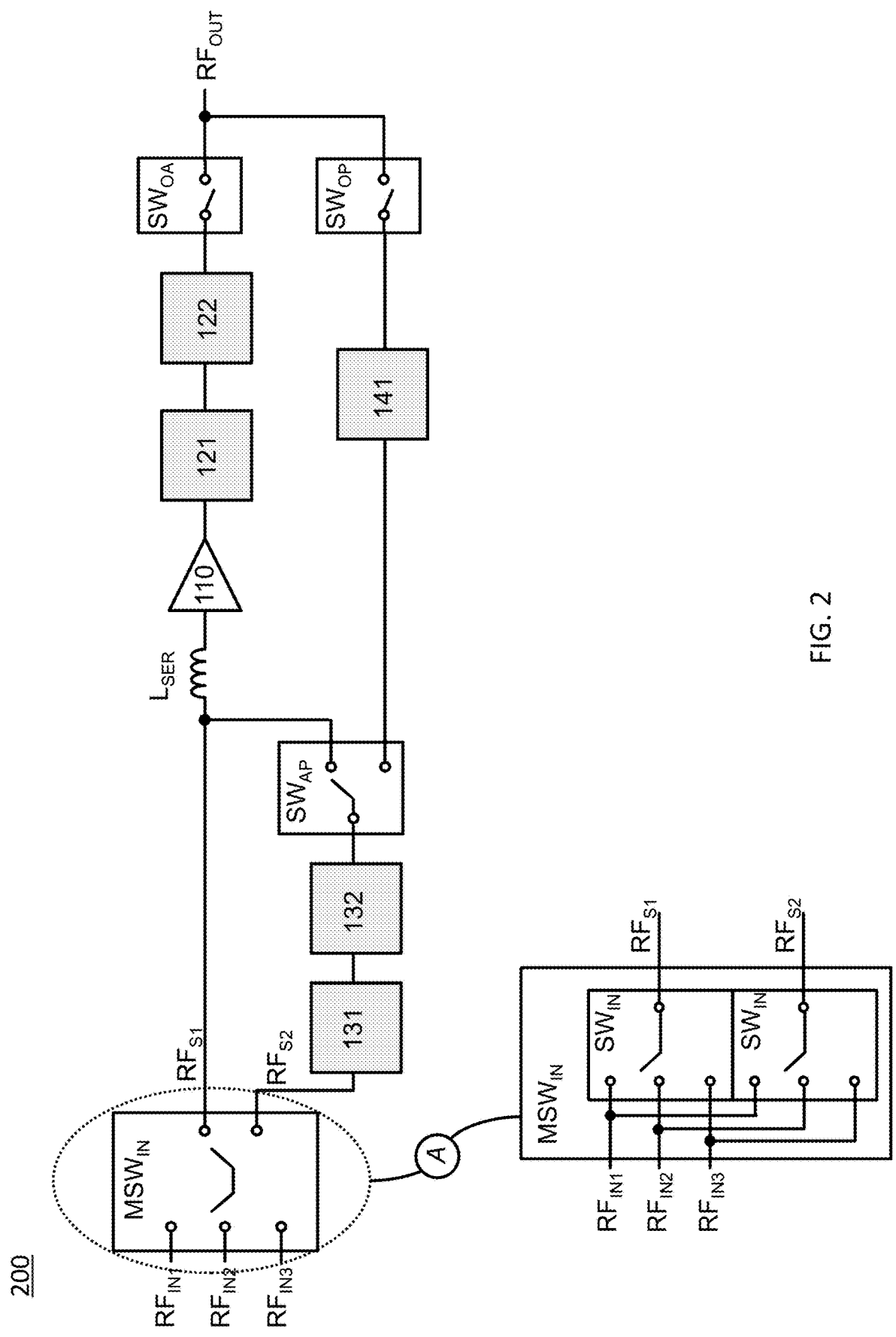
FIG. 2 shows a simplified schematic of a multi-input and multi-gain RF processing circuit comprising a switchable active path and a switchable passive path.

FIG. 2 shows a simplified schematic of a multi-input and multi-gain RF processing circuit (200) comprising a switchable active path ($L_{SER}$, 110, 121, 122, $SW_{OA}$) and a switchable passive path (131, 132, $SW_{AP}$, 141, $SW_{OP}$). A person skilled in the art will clearly identify similarities and differences of such configuration (200) with respect to the configuration (100) described above with reference to FIG. 1. In particular, the switchable passive path (131, 132, $SW_{AP}$, 141, $SW_{OP}$) includes a first switchable path segment (131, 132, $SW_{AP}$) that may be selectively coupled via the switch $SW_{AP}$ to either the switchable active path ($L_{SER}$, 110, 121, 122, $SW_{OA}$) or to a second switchable path segment (141, $SW_{OP}$) of the switchable passive path (131, 132, $SW_{AP}$, 141, $SW_{OP}$).

With continued reference to FIG. 2, during a passive attenuation mode (gain≤0 dB), the switchable passive path (131, 132, $SW_{AP}$, 141, $SW_{OP}$) is enabled/activated by configuring the switch $SW_{AP}$ to couple the first switchable path segment (131, 132, $SW_{IP}$) to the second switchable path segment (141, $SW_{OP}$). Accordingly, a selected RF signal, $RF_{S2}$, of the plurality of input RF signals (e.g., $RF_{IN1}$, $RF_{IN2}$, $RF_{IN3}$, etc.) via the input switch $MSW_{IN}$ may be processed/attenuated by the two attenuators (131, 132) of the first switchable path segment (131, 132, $SW_{AP}$) and by the attenuator (141) of the second switchable path segment (141, $SW_{OP}$), and output as the $RF_{OUT}$ signal through the switch $SW_{OP}$.

The configuration (200) of FIG. 2 includes an active attenuation mode provided by coupling of the first switchable path segment (131, 132, $SW_{AP}$) to the switchable active path ($L_{SER}$, 110, 121, 122, $SW_{OA}$). Accordingly, a selected RF signal, $RF_{S2}$, of the plurality of input RF signals (e.g., $RF_{IN1}$, $RF_{IN2}$, $RF_{IN3}$, etc.) via the input switch $MSW_{IN}$ may be processed/attenuated by the two attenuators (131, 132) of the first switchable path segment (131, 132, $SW_{AP}$) and further processed/attenuated through the elements (110, 121, 122) of the switchable active path. Differently from the configuration (100) of FIG. 1, the configuration (200) allows for attenuation (e.g., via 131, 132) prior to amplification (e.g., via 110), and therefore for a reduced attenuation post amplification when compared to the configuration (100). Accordingly, for a same attenuation mode (e.g., gain setting, level of attenuation), the configuration (200) of FIG. 2 may provide an improved linearity/distortion performance when compared to the configuration (100) of FIG. 1.

With continued reference to FIG. 2, RF signal amplification may be provided through the switchable active path ($L_{SER}$, 110, 121, 122, $SW_{OA}$). Operation during such (active) amplification mode is similar to one described above with reference to FIG. 1. In other words, a selected RF signal, $RF_{S1}$, of the plurality of input RF signals (e.g., $RF_{IN1}$, $RF_{IN2}$, $RF_{IN3}$, etc.) via the input switch $MSW_{IN}$ may be processed/amplified via elements (110, 121, 122), and output as the $RF_{OUT}$ signal through the switch $SW_{OA}$.

Similar to the configuration (100) of FIG. 1, the configuration (200) of FIG. 2 includes two switches $MSW_{IN}$ and $SW_{AP}$ coupled to the input of the amplifier (110). However, such switches are complex switches (e.g., multi-pole multi-throw MPMT) which may include added parasitic capacitance when compared to the simpler switches $SW_{IN}$ and $SW_{IP}$ of FIG. 1 (e.g., single-pole single-throw). For example, as shown in the detail A of FIG. 2, the switch $MSW_{IN}$ may be equivalent to two switches $SW_{IN}$ of FIG. 1 having respective throws coupled to the input RF signals (e.g., $RF_{IN1}$, $RF_{IN2}$, $RF_{IN3}$, etc.) for provision of selected RF signals $RF_{S1}$ and $RF_{S2}$ at respective poles of the two switches. Such added parasitic capacitance coupled to the input of the amplifier (110) may in turn adversely affect noise figure.

Although the configuration (200) of FIG. 2 may provide an improved linearity/distortion performance during the active attenuation mode when compared to the configuration (100) of FIG. 1, such improved performance is obtained at a cost of a degraded noise figure performance due to the added capacitive loading of the (complex) switches.

Figure 3A:
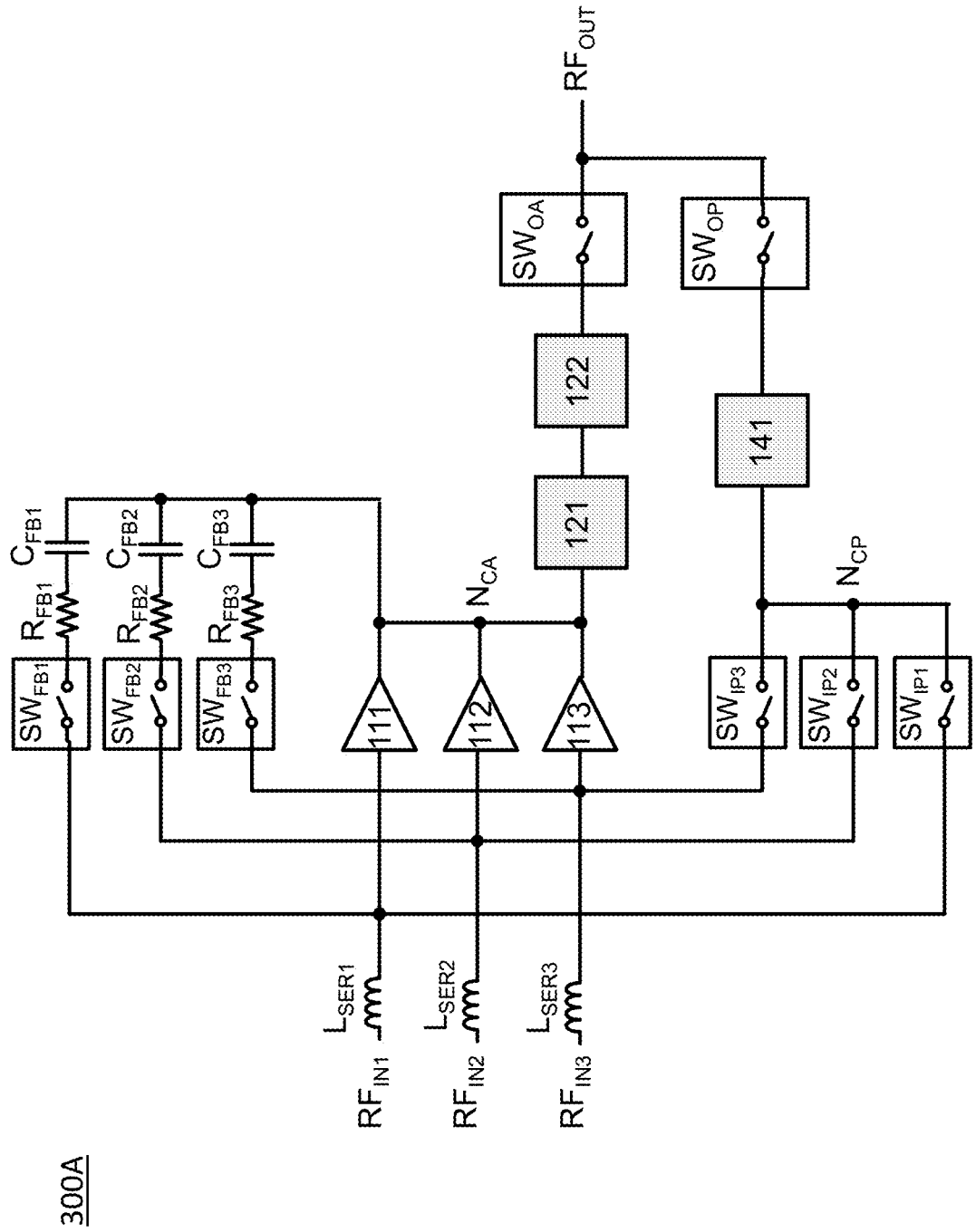
FIG. 3A shows a simplified schematic of a multi-input and multi-gain RF processing circuit according to an embodiment of the present disclosure comprising dedicated switchable active paths that may be selectively coupled to respective switchable feedback paths, and dedicated switchable passive paths.

FIG. 3A shows a simplified schematic of a multi-input and multi-gain RF processing circuit (300A) which is devoid of an input switch (e.g., $SW_{IN}$ of FIG. 1, $MSW_{IN}$ of FIG. 2) for selecting of an input RF signal of the plurality of RF signals (e.g., $RF_{IN1}$, $RF_{IN2}$, $RF_{IN3}$, etc.). Instead, the configuration (300A) includes redundant elements that are dedicated for processing of respective input RF signals. Such redundant elements include, for example, a) switches ($SW_{IP1}$, $SW_{IP2}$, $SW_{IP3}$) for provision of respective switchable passive paths ($SW_{IPn}$, 141, $SW_{OP}$), for n=1, 2, 3, etc.; b) amplifiers (111, 112, 113) for provision of respective switchable active paths (11n, 121, 122, $SW_{OA}$) for n=1, 2, 3, etc.; and c) switches ($SW_{FB1}$, $SW_{FB2}$, $SW_{FB3}$) for provision of respective switchable (passive) feedback paths ($SW_{FBn}$, $R_{FBn}$, $C_{FBn}$), for n=1, 2, 3, etc., such switchable feedback paths selectively coupled to respective amplifiers (e.g., 111, 112, 113) for control of gain, including for active amplification mode (i.e., gain≥0 dB) and active attenuation mode (i.e., gain≤0 dB). Further redundancy may include series connected inductors (e.g., $L_{SER1}$, $L_{SER2}$, $L_{SER3}$, etc.) dedicated to each input RF signal (e.g., $RF_{IN1}$, $RF_{IN2}$, $RF_{IN3}$, etc.)

With continued reference to FIG. 3A, the configuration (300A) may allow active attenuation mode via a switchable feedback path ($SW_{FBn}$, $R_{FBn}$, $C_{FBn}$) coupled between input and output of a respective amplifier (11n, n=1, 2, 3, etc.). As known to a person skilled in the art, such feedback may allow reducing a gain of an amplifier via selection of the resistance $R_{FBn}$, while the capacitance $C_{FBn}$ may be used to decouple DC components between input and output of the amplifier. Accordingly, the active attenuation mode (with feedback) provided by the configuration (300A) may include a reduced number of attenuators when compared to the configuration (100) of FIG. 1. Furthermore, in contrast to the configuration (200) of FIG. 2, the active attenuation mode of the configuration (300A) may be provided without any attenuator at the input side of (prior to) the amplifier (e.g., 111, 112, 113). Finally, capacitive loading due to the (simple SPST) switches (e.g., $SW_{FBn}$, $SW_{IPn}$, n=1, 2, 3, etc.) at the input of the amplifier (e.g., 11n, n=1, 2, 3, etc.) may be reduced compared to the configuration (200) of FIG. 2 (e.g., that includes complex MPMT switch $MSW_{IN}$) as well as the configuration (100) of FIG. 1 (e.g., that includes a complex single-pole multi-throw SPMT switch $SW_{IN}$).

With further reference to FIG. 3A, it should be noted that the configuration (300A) may not be limited to any number of input RF signals (e.g., $RF_{IN1}$, $RF_{IN2}$, $RF_{IN3}$, etc.), and therefore can be implemented for a single input configuration (n=1) or a configuration having any number of inputs (n=N, with N>1).

As shown in FIG. 3A, the amplifiers (11n, n=1, 2, 3, etc.) of the switchable active paths (11n, 121, 122, $SW_{OA}$, n=1, 2, 3, etc.) include outputs that are coupled to a common node, $N_{CA}$. Furthermore, the switchable (passive) feedback paths ($SW_{FBn}$, $R_{FBn}$, $C_{FBn}$, n=1, 2, 3, etc.) are coupled at one end to the common node, $N_{CA}$, and at the other end to respective inputs of the amplifiers (11n, n=1, 2, 3, etc.), thereby providing respective (output to input) feedbacks to each of the amplifiers. Accordingly, the switchable active paths (11n, 121, 122, $SW_{OA}$, n=1, 2, 3, etc.) include a common switchable path segment (121, 122, $SW_{OA}$) coupled between the common node, $N_{CA}$, and the output node (e.g., $RF_{OUT}$). In other words, RF processing through the switchable active paths (11n, 121, 122, $SW_{OA}$, n=1, 2, 3, etc.) include conduction through a common path defined by the elements (121, 122, $SW_{OA}$).

With continued reference to FIG. 3A, (input) switches ($SW_{IPn}$, n=1, 2, 3, etc.) selectively couple (and decouple) respective input RF signals ($RF_{INn}$, n=1, 2, 3, etc.) to a common switchable path segment (141, $SW_{OP}$) of the switchable passive paths ($SW_{IPn}$, 141, $SW_{OP}$, n=1, 2, 3, etc.). In other words, each of the switches ($SW_{IPn}$, n=1, 2, 3, etc.) is coupled between a respective input RF signals ($RF_{INn}$, n=1, 2, 3, etc.) and a common node, $N_{CP}$. It follows that the common switchable path segment (141, $SW_{OP}$) is coupled between the common node, $N_{CP}$, of the switchable passive paths ($SW_{IPn}$, 141, $SW_{OP}$, n=1, 2, 3, etc.) and the output node (e.g., $RF_{OUT}$), and RF processing through the switchable passive paths ($SW_{IPn}$, 141, $SW_{OP}$, n=1, 2, 3, etc.) includes conduction through a common (conduction) path defined by the elements (141, $SW_{OA}$).

Activation of an active amplification mode for a selected input RF signal, $RF_{INk}$, k=1, 2, 3, etc., of the configuration (300A) may include: enabling/activating of the amplifier (11k); disabling of all other amplifiers (11n, n≠k); enabling (i.e., turning ON, closing) of the switch $SW_{OA}$; disabling (i.e., turning OFF, opening) of the switch $SW_{OP}$; and turning OFF of all other switches ($SW_{FBn}$, $SW_{IPn}$, n=1, 2, 3, etc.). Activation of an active attenuation mode for the selected input RF signal, $RF_{INk}$, of the configuration (300A) may include all of the steps described above for activation of the active amplification mode, at the exception of the switch $SW_{FBk}$ that should be turned ON in order to enable feedback for the amplifier (11k). Activation of a passive attenuation mode for the selected input RF signal, $RF_{INk}$, of the configuration (300A) may include: enabling (i.e., turning ON, closing) of the switches $SW_{IPk}$ and $SW_{OP}$; disabling/deactivating of all of the amplifiers (11n, n=1, 2, 3, etc.); and disabling of all other switches ($SW_{FBn}$, n=1, 2, 3, etc.), ($SW_{IPn}$, n≠k) and $SW_{OA}$.

Figure 3B:
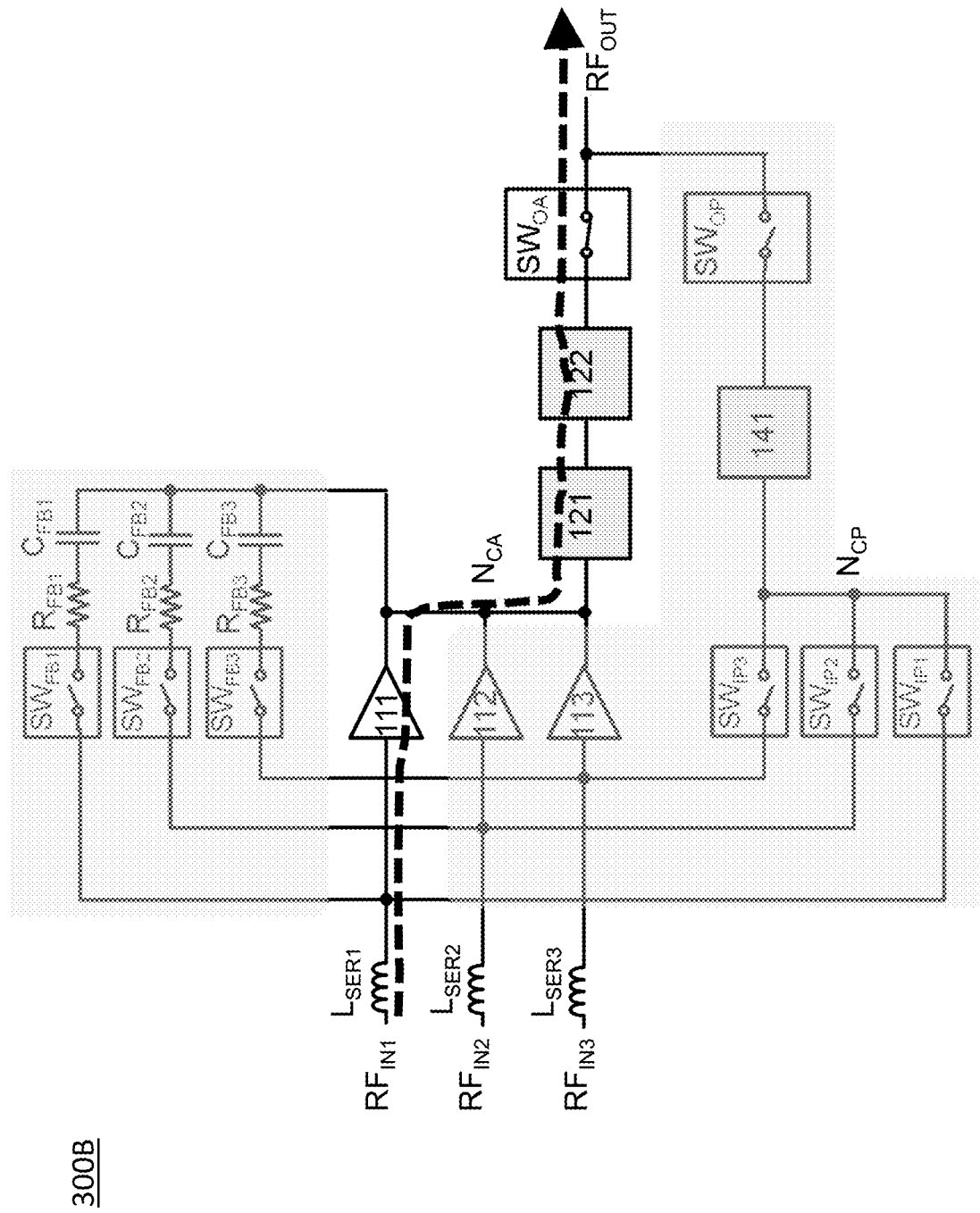
FIG. 3B shows processing of an input RF signal through a dedicated switchable active path of the configuration shown in FIG. 3A.

FIG. 3B shows a configuration (300B) of the multi-input multi-gain RF processing circuit of FIG. 3A for processing of an input RF signal, $RF_{IN1}$, through a dedicated switchable active path (I1k, 121, 122, $SW_{OA}$, k=1). In other words, the configuration (300B) shows a processing path of a selected RF signal, $RF_{INk}$, k=1, for the active amplification mode. As described above, provision of such configuration includes enabling/activating of the amplifier (111); disabling of all other amplifiers (e.g., 112, 113); enabling (i.e., turning ON, closing) of the switch $SW_{OA}$; disabling (i.e., turning OFF, opening) of the switch $SW_{OP}$; and turning OFF of all other switches ($SW_{FBn}$, $SW_{IPn}$, n=1, 2, 3, etc.).

Figure 3C:
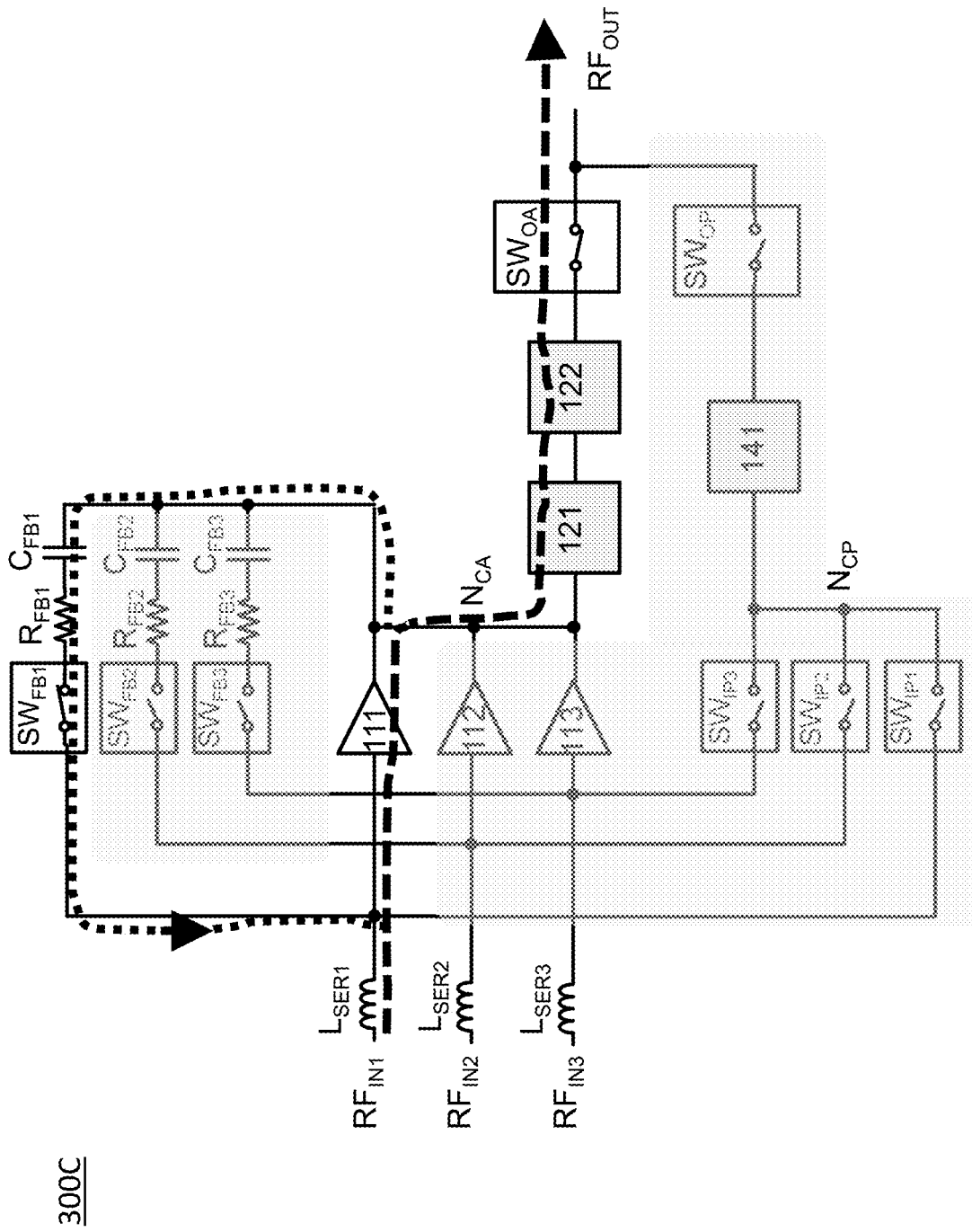
FIG. 3C shows processing of an input RF signal through a dedicated switchable active path that is coupled to a respective switchable feedback path of the configuration shown in FIG. 3A.

FIG. 3C shows a configuration (300C) of the multi-input multi-gain RF processing circuit of FIG. 3A for processing of an input RF signal, $RF_{IN1}$, through a dedicated switchable active path (11k, 121, 122, $SW_{OA}$, k=1) coupled to a respective switchable feedback path ($SW_{FB1}$, $R_{FB1}$, $C_{FB1}$). In other words, the configuration (300C) shows a processing path of a selected RF signal, $RF_{INk}$, k=1, for the active attenuation mode. As described above, provision of such configuration includes enabling/activating of the amplifier (111); disabling of all other amplifiers (e.g., 112, 113); enabling (i.e., turning ON, closing) of the switch $SW_{OA}$; disabling (i.e., turning OFF, opening) of the switch $SW_{OP}$; turning ON of the switch $SW_{FB1}$; and turning OFF of switches ($SW_{FB2}$, $SW_{FB3}$) and ($SW_{IPn}$, n=1, 2, 3, etc.).

Figure 3D:
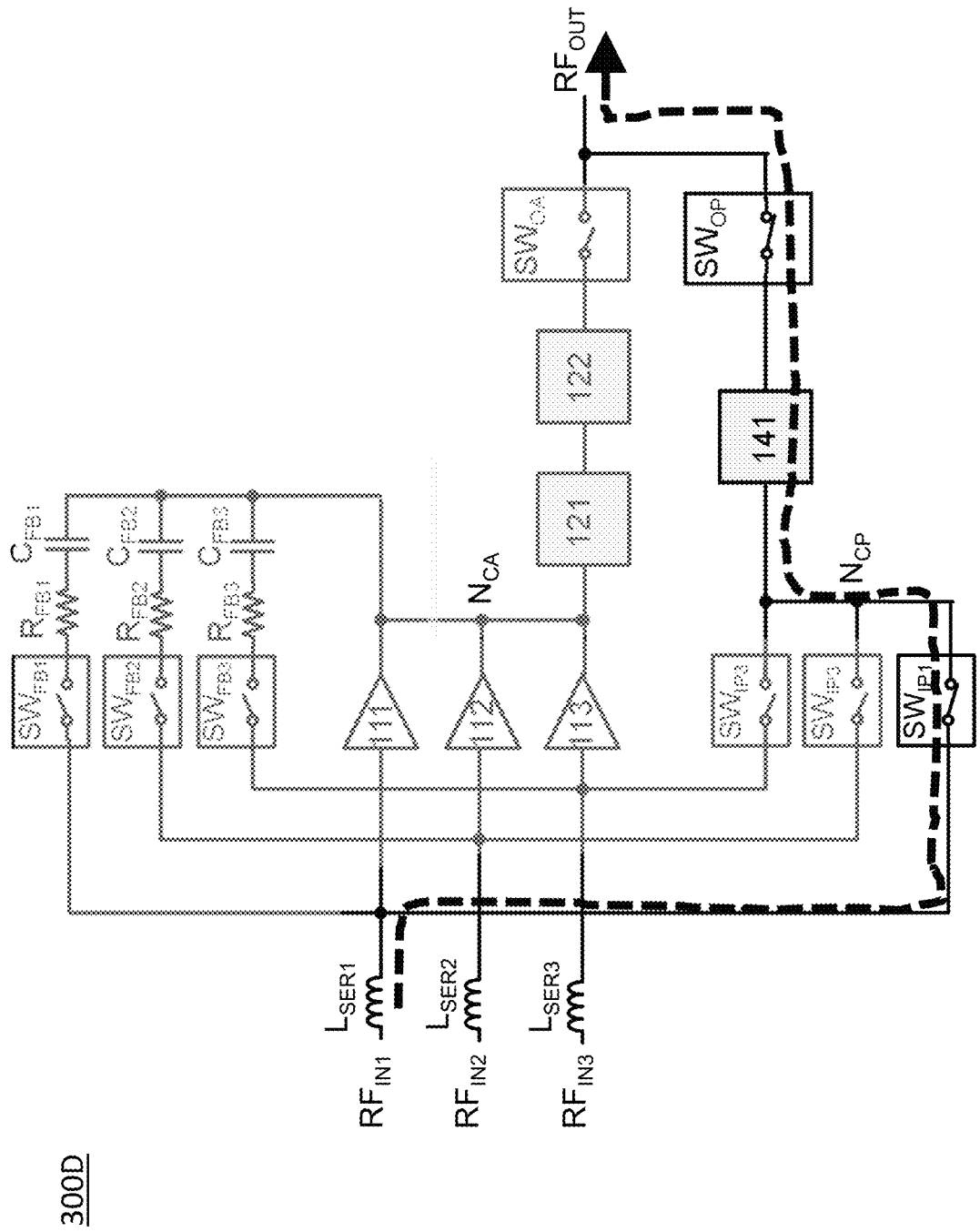
FIG. 3D shows processing of an input RF signal through the switchable passive path of the configuration shown in FIG. 3A.

FIG. 3D shows a configuration (300D) of the multi-input multi-gain RF processing circuit of FIG. 3A for processing of an input RF signal, $RF_{IN1}$, through a dedicated switchable passive path ($SW_{IPk}$, 141, $SW_{OP}$, k=1). In other words, the configuration (300D) shows a processing path of a selected RF signal, $RF_{INk}$, k=1, for the passive amplification mode. As described above, provision of such configuration includes enabling of the switches $SW_{IP1}$ and $SW_{OP}$; disabling/deactivating of all of the amplifiers (11n, n=1, 2, 3, etc.); and disabling of all other switches ($SW_{FBn}$, n=1, 2, 3, etc.), ($SW_{IP2}$, $SW_{IP3}$) and $SW_{O4}$.

Figure 4A:
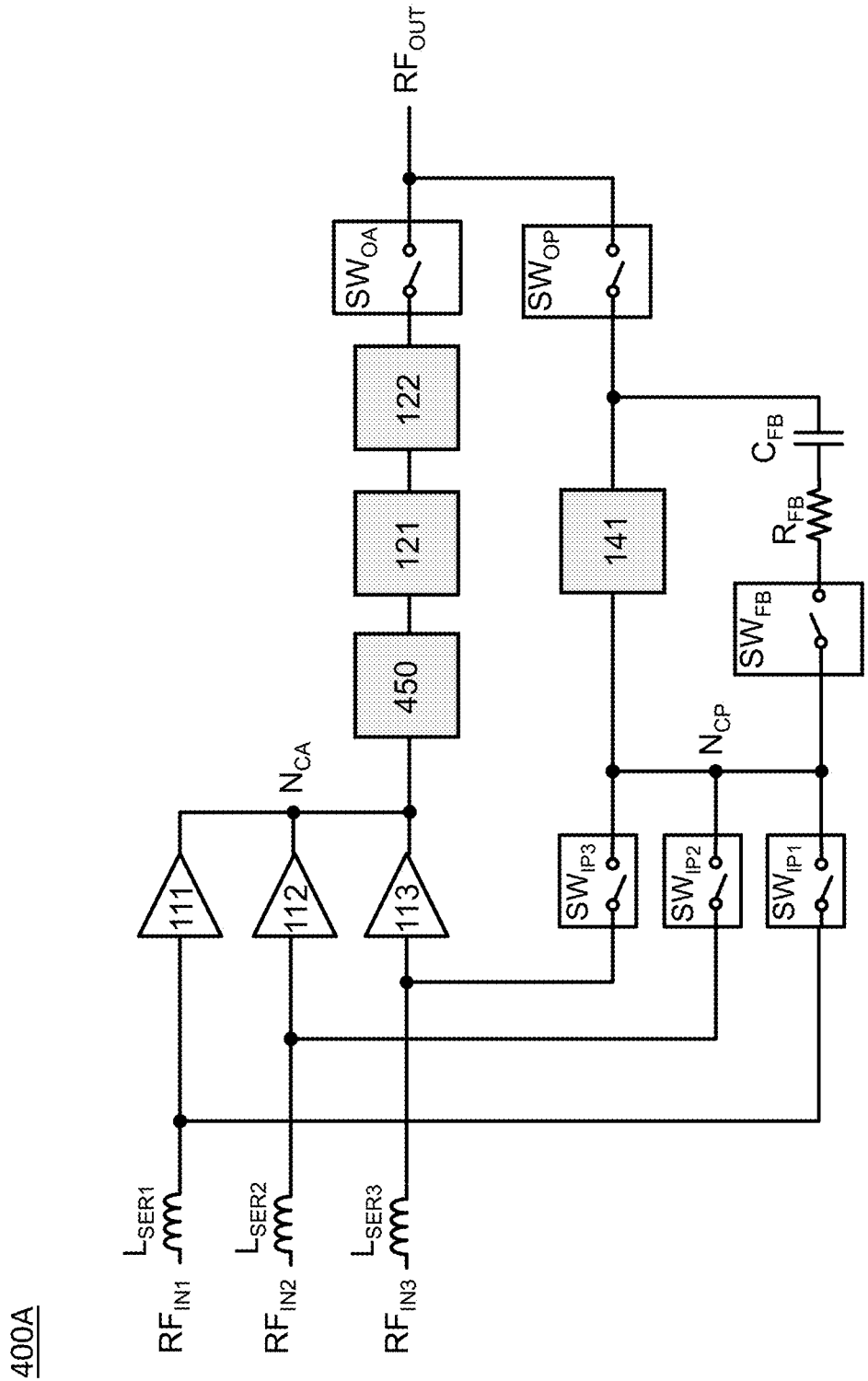
FIG. 4A shows a simplified schematic of a multi-input and multi-gain RF processing circuit according to an embodiment of the present disclosure comprising dedicated switchable active paths that may be selectively coupled to a common switchable feedback path, and dedicated switchable passive paths.

FIG. 4A shows a simplified schematic of a multi-input and multi-gain RF processing circuit (400A) according to an embodiment of the present disclosure comprising dedicated switchable active paths (11n, 121, 122, $SW_{O4}$, n=1, 2, 3, etc.) that may be selectively coupled to a common switchable feedback path ($SW_{FB}$, $R_{FB}$, $C_{FB}$), and dedicated switchable passive paths ($SW_{IPn}$, 141, $SW_{OP}$, n=1, 2, 3, etc.). In particular, the configuration (400A) of FIG. 4A is based on the configuration (300A) of FIG. 3A wherein elements of the switchable passive paths ($SW_{IPn}$, 141, $SW_{OP}$, n=1, 2, 3, etc.) are reused for selective coupling of the common switchable feedback path ($SW_{FB}$, $R_{FB}$, $C_{FB}$) to the switchable active paths (11n, 121, 122, $SW_{O4}$, n=1, 2, 3, etc.). This includes reuse of the input switches ($SW_{IPn}$, n=1, 2, 3, etc.) and the output switch $SW_{OP}$ of the switchable passive paths ($SW_{IPn}$, 141, $SW_{OP}$, n=1, 2, 3, etc.).

The configuration (400A) of FIG. 4A may provide all of the benefits of the configuration (300A) described above with reference to FIG. 3A, with added benefits provided by a reduction of (parasitic) capacitive loading to inputs of the amplifiers (11n, n=1, 2, 3, etc.) due to a lesser number of switches (i.e., removal of all but one of the switches $SW_{FBn}$, n=1, 2, 3, etc.) coupled to such inputs, as well as a reduction in number of elements, and therefore cost and physical area, of the circuit.

With further reference to FIG. 4A, during an active amplification mode, one of the amplifiers (11n, n=1, 2, 3, etc.) may be activated (e.g., turned ON, enabled) while the other amplifiers are deactivated, and the switch $SW_{O4}$ may be turned ON to couple the amplified RF signal to the output node (e.g., $RF_{OUT}$). Furthermore, switches ($SW_{IPn}$, n=1, 2, 3, etc.) and $SW_{OP}$ may be turn OFF to avoid conduction through the attenuator (141) and the common switchable feedback path ($SW_{FB}$, $R_{FB}$, $C_{FB}$). An exemplary processing path (400B) of the input RF signal, $RF_{N1}$, for the active amplification mode provided by the configuration (400A) of FIG. 4A is shown in FIG. 4B.

Figure 4B:
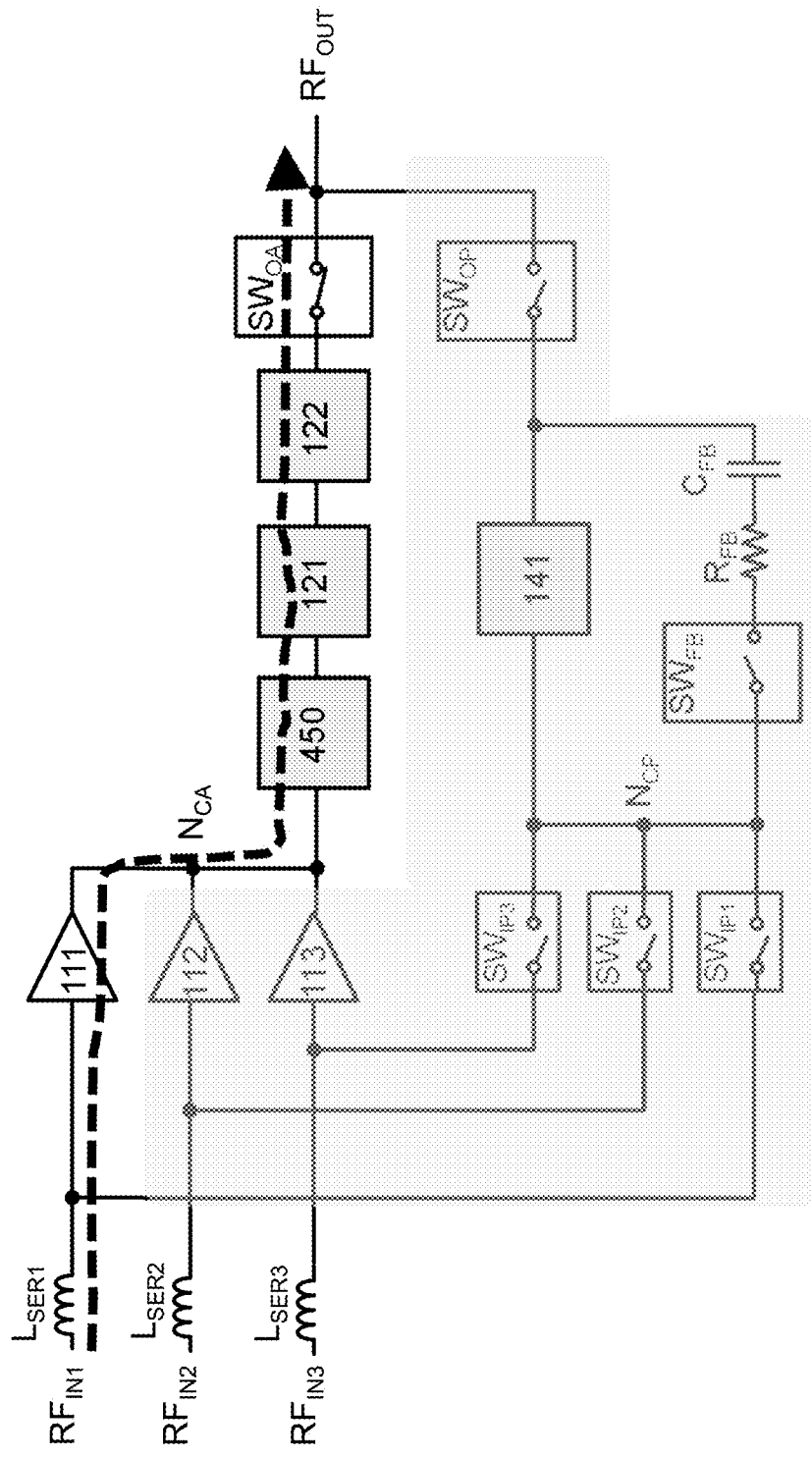
FIG. 4B shows processing of an input RF signal through a dedicated switchable active path of the configuration shown in FIG. 4A.
Figure 4C:
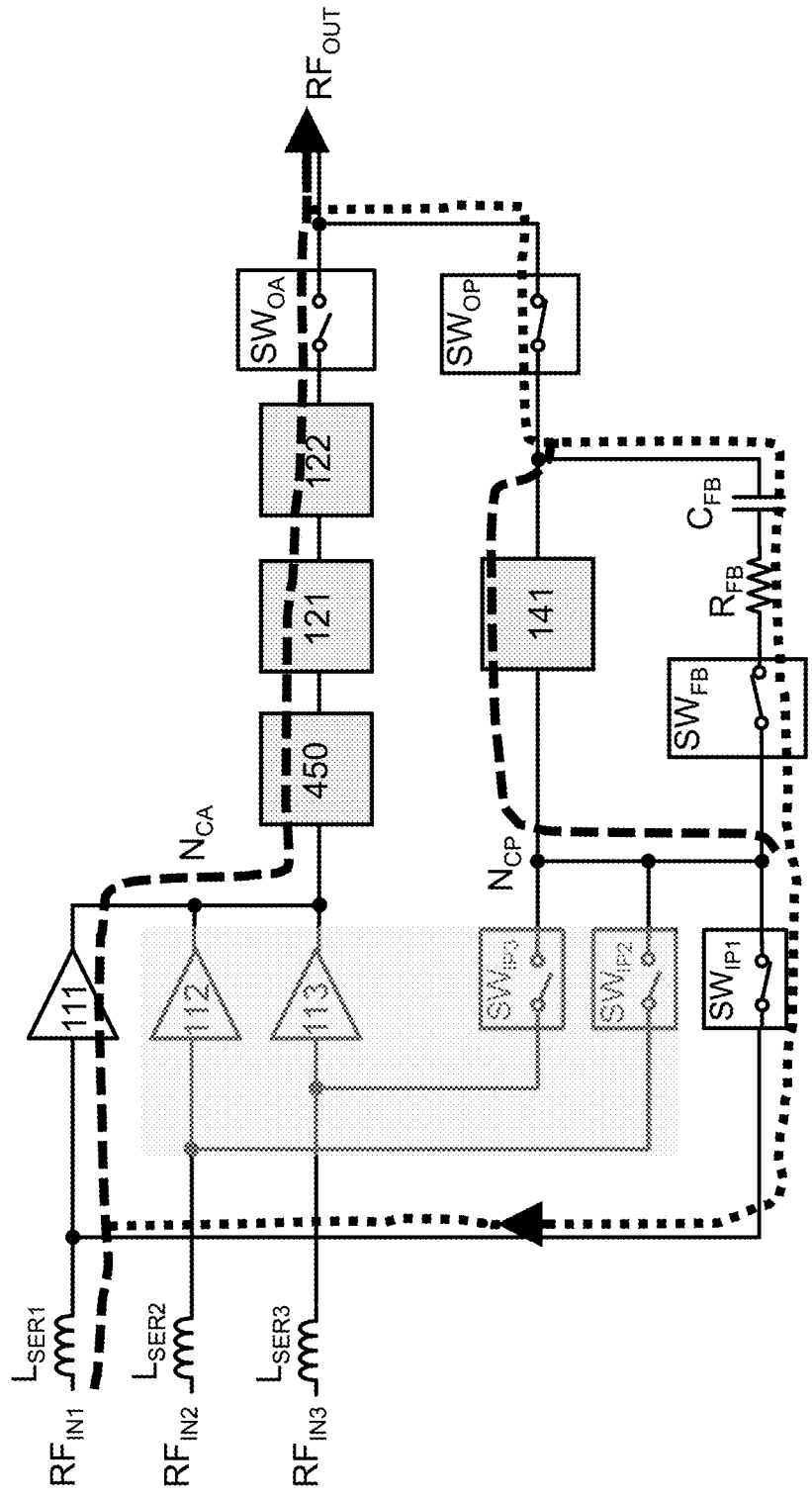
FIG. 4C shows processing of an input RF signal through a dedicated switchable passive path that is coupled to the switchable feedback path of the configuration shown in FIG. 4A.

Active attenuation mode of the configuration (400A) shown in FIG. 4A may be provided by further coupling of the common switchable feedback path ($SW_{FB}$, $R_{FB}$, $C_{FB}$) to a conduction path provided by the active amplification mode (e.g., conduction path shown in FIG. 4B). This includes closing of a corresponding (input) switch ($SW_{IPn}$, n=1, 2, 3, etc.) to couple one end of the common switchable feedback path ($SW_{FB}$, $R_{FB}$, $C_{FB}$) that is coupled to the common node, $N_{CP}$, to an input of an activated amplifier (11n, n=1, 2, 3, etc.), and closing of the switch $SW_{OP}$ to couple the output node (e.g., $RF_{OUT}$) to the other end of the common switchable feedback path ($SW_{FB}$, $R_{FB}$, $C_{FB}$). According to one embodiment of the present disclosure, a provided feedback path may be limited to conduction through elements ($C_{FB}$, $R_{FB}$) by configuring the attenuator (141) for isolation mode (e.g., high series impedance) while turning ON the switch $SW_{FB}$. According to another embodiment of the present disclosure, a provided feedback path may further include conduction through the attenuator (141) by configuring such attenuator for an impedance appropriate for conduction (e.g., different from high series impedance) while switch $SW_{FB}$ remains ON. An exemplary processing path (400C) of the input RF signal, $RF_{N1}$, for the active attenuation mode provided by the configuration (400A) of FIG. 4A is shown in FIG. 4C. In FIG. 4C, a conduction path of the RF signal for further attenuation/feedback control through the attenuator (141) is shown with a different dashed/dotted line.

Figure 4D:
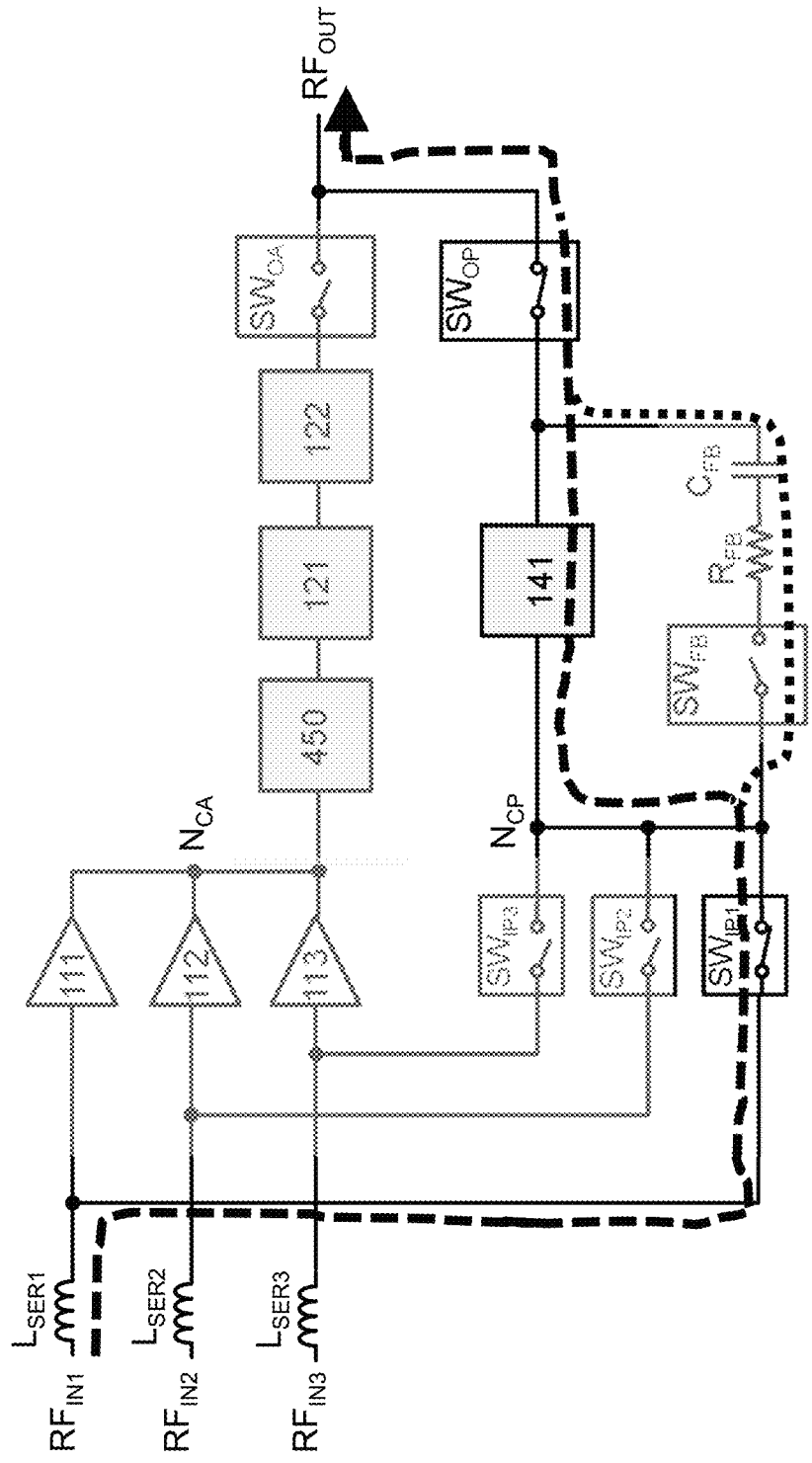
FIG. 4D shows processing of an input RF signal through the switchable passive path of the configuration shown in FIG. 4A.

With further reference to FIG. 4A, during a passive attenuation mode, one of the switches ($SW_{IPn}$, n=1, 2, 3, etc.) may be turned ON to selectively couple an input RF signal (e.g., $RF_{INk}$, k=1, 2, 3, etc.) for processing through the attenuator (141) that is coupled between the common node, $N_{CP}$ and the switch $SW_{OP}$, and the switch $SW_{OP}$ may be turned ON to selectively couple the attenuated RF signal to the output node (e.g., $RF_{OUT}$). Furthermore, in order to avoid conduction through the common switchable feedback path ($SW_{FB}$, $R_{FB}$, $C_{FB}$), the switch $SW_{FB}$ may be turned OFF during the passive attenuation mode. In some embodiment of the present disclosure, the switch $SW_{FB}$, may be turned ON in order to provide further control of the attenuation during the passive attenuation mode. Such further control of the attenuation is based on conduction through parallel conduction paths/segments provided by the attenuator (141) and the common switchable feedback path ($SW_{FB}$, $R_{FB}$, $C_{FB}$). Amplifiers (11n, n=1, 2, 3, etc.) may be deactivated and the switch $SW_{O4}$ may be turned OFF during the passive attenuation mode. An exemplary processing path (400D) of the input RF signal, $RF_{N1}$, for the passive attenuation mode provided by the configuration (400A) of FIG. 4A is shown in FIG. 4D. In FIG. 4D, a conduction path of the RF signal for further attenuation control through the common switchable feedback path ($SW_{FB}$, $R_{FB}$, $C_{FB}$) is shown with a different dashed/dotted line.

In the configuration (400A) of FIG. 4A, element (450) refers to a match circuit that is configured to provide impedance matching between the output of the amplifier (e.g., 11n, n=1, 2, 3, etc.) and the attenuator (121). As known to a person skilled in the art, the various elements of the multi-input and multi-gain RF processing circuit (400A) of FIG. 4A, including attenuators (121, 122) and inductors ($L_{SERn}$, n=1, 2, 3, etc.) may be designed in view of a desired characteristic impedance of the circuit (at a frequency of operation of the circuit), traditionally of a (nonlimiting) value that is equal to 50 Ohms. This means that impedance seen at the input (e.g., nodes carrying $RF_{INn}$, n=1, 2, 3, etc.) and output nodes (e.g., node carrying $RF_{OUT}$) of the circuit (400A) may be equal to 50 Ohms. Accordingly, during the active attenuation mode feedback is provided by coupling the common switchable feedback path ($SW_{FB}$, $R_{FB}$, $C_{FB}$) to the relatively low impedance output node (e.g., $RF_{OUT}$ at 50 Ohms) as shown in FIG. 4A. However, coupling to a higher impedance node may provide some advantages, including for example, higher voltage swings and thus higher feedback resistor values (e.g., $R_{FB}$) in the feedback path for a larger open loop gain which is advantageous in a feedback system. Furthermore, as known to a person skilled in the art, an output impedance of the amplifier (e.g., 11n, n=1, 2, 3, etc.) may be a function of a size of transistors used in the amplifier which in turn may be a function of a power (e.g., bias current) of the amplifier. Accordingly, a low noise amplifier (LNA) that is configured to operate at low power may have an output impedance that is substantially higher than a power amplifier (PA) that is configured to operate at substantially higher power. For example, the output impedance of an LNA may be substantially higher than 50 Ohms, and the output impedance of a PA may be substantially lower than 50 Ohms. Teachings according to the present disclosure take advantage of the output impedance of the amplifier (e.g., 11n, n=1, 2, 3, etc.) to provide a feedback path coupled to a higher impedance node. This is shown in the embodiment represented by FIG. 5A.

Figure 5A:
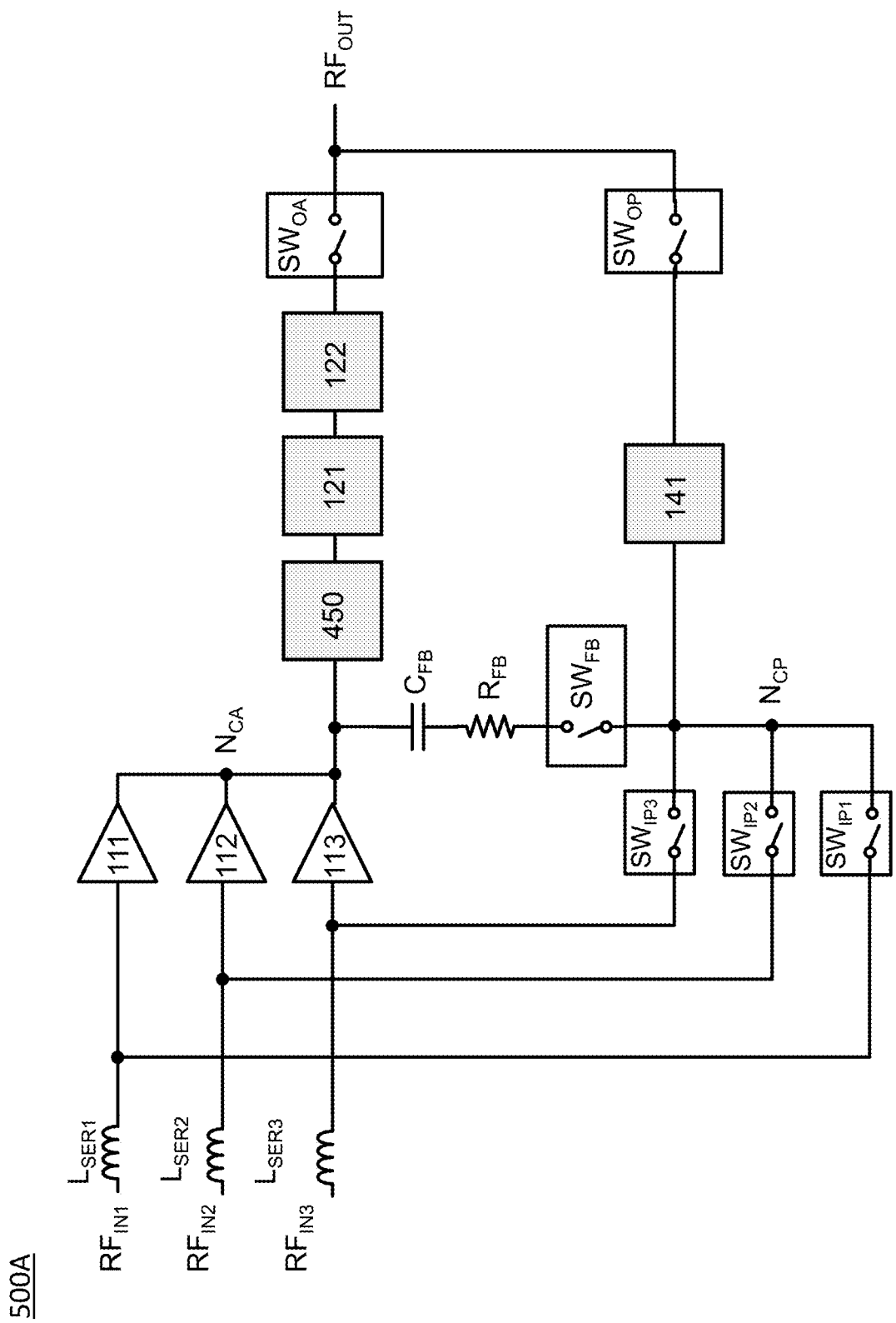
FIG. 5A shows a simplified schematic of a multi-input and multi-gain RF processing circuit according to another embodiment of the present disclosure comprising dedicated switchable active paths that may be selectively coupled to a switchable feedback path, and a switchable passive path.

FIG. 5A shows a simplified schematic of a multi-input and multi-gain RF processing circuit (500A) according to an embodiment of the present disclosure comprising dedicated switchable active paths (11n, 121, 122, $SW_{OA}$, n=1, 2, 3, etc.) that may be selectively coupled to a common switchable feedback path ($SW_{FB}$, $R_{FB}$, $C_{FB}$), and dedicated switchable passive paths ($SW_{IPn}$, 141, $SW_{OP}$, n=1, 2, 3, etc.). In particular, the configuration (500A) is based on the configuration (400A) wherein the switches ($SW_{IPn}$, n=1, 2, 3, etc.) of the switchable passive paths ($SW_{IPn}$, 141, $SW_{OP}$, n=1, 2, 3, etc.) are reused for selective coupling of one end (coupled to common node $N_{CP}$) of the common switchable feedback path ($SW_{FB}$, $R_{FB}$, $C_{FB}$) to inputs of respective amplifiers (11n, n=1, 2, 3, etc.) of the switchable active paths (11n, 121, 122, $SW_{OA}$, n=1, 2, 3, etc.), while the other end of the common switchable feedback path ($SW_{FB}$, $R_{FB}$, $C_{FB}$) is coupled (e.g., connected) to the common node, $N_{CA}$. Accordingly, for an exemplary case where the multi-input and multi-gain RF processing circuit (500A) is used in a receive side of an RF frontend module, an impedance at the common node, $N_{CA}$, may be provided by an output impedance of the LNA (11n, n=1, 2, 3, etc.), and therefore at a value that may be substantially higher than the impedance at the output node (e.g., $RF_{OUT}$). It should be noted that in order to take advantage of the higher output impedance of the LNA, the common switchable feedback path ($SW_{FB}$, $R_{FB}$, $C_{FB}$) may be coupled directly to the output of the LNA (11n, n=1, 2, 3, etc.) and before the match circuit (450).

Figure 5B:
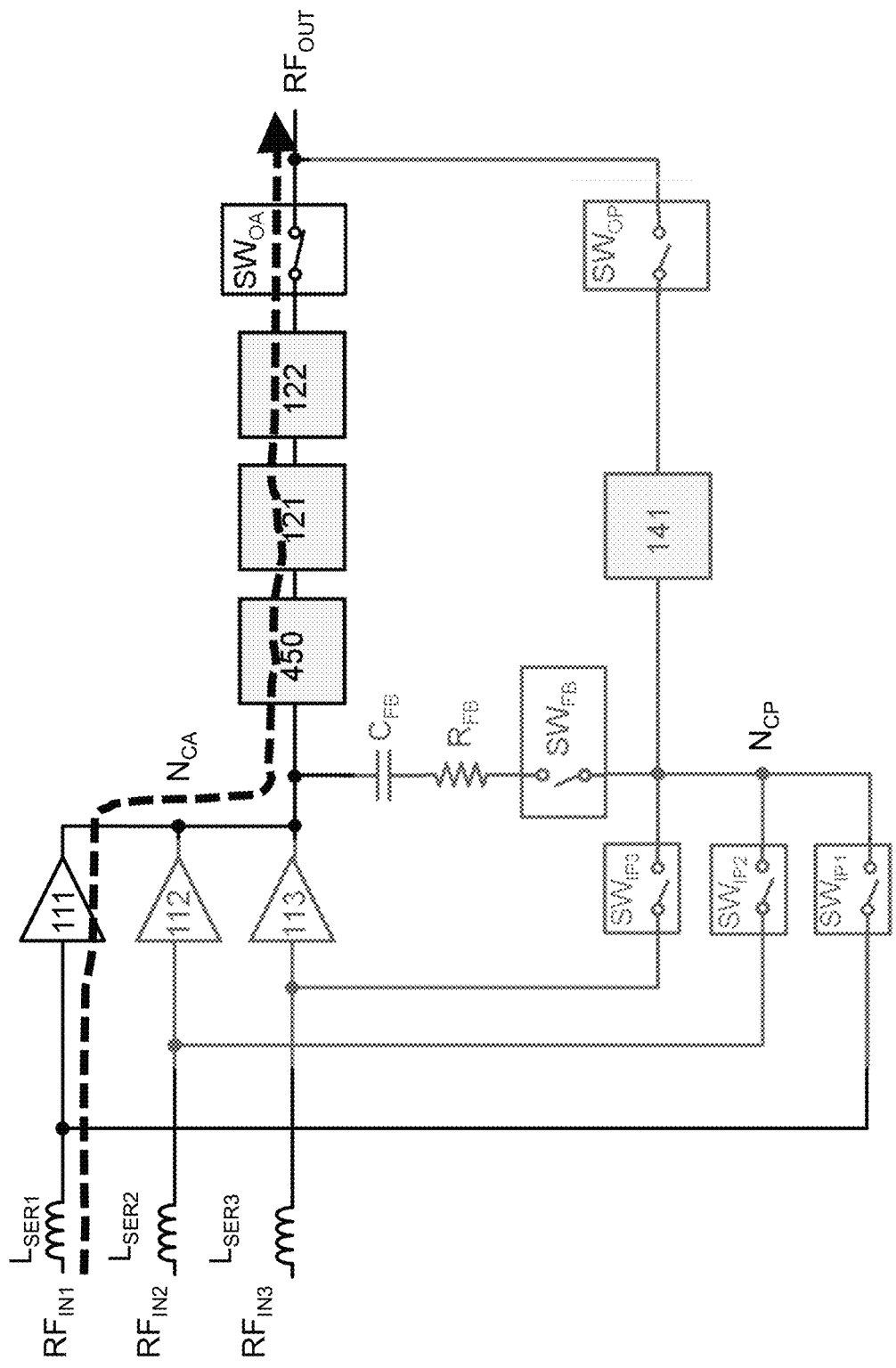
FIG. 5B shows processing of an input RF signal through a dedicated switchable active path of the configuration shown in FIG. 5A.

An exemplary processing path (500B) of the input RF signal, $RF_{IN1}$, for the active amplification mode provided by the configuration (500A) of FIG. 5A is shown in FIG. 5B. In such mode of operation, only one of the amplifiers (e.g., 111) is activated while the other (e.g., 112, 113) are deactivated. Furthermore, as shown in FIG. 5B, the switch $SW_{OA}$ may be turned ON (i.e., closed) to couple the amplified RF signal trough the amplifier (111) to the output node (e.g., $RF_{OUT}$). As described above with reference to other figures, the attenuators (e.g., 121, 122) may be configured to provide a desired level of amplification through the processing path (e.g., 111, 450, 121, 122). All other switches, including ($SW_{IPn}$, n=1, 2, 3, etc.), $SW_{FB}$ and $SW_{OP}$ may be turned OFF as shown in FIG. 5B.

Figure 5C:
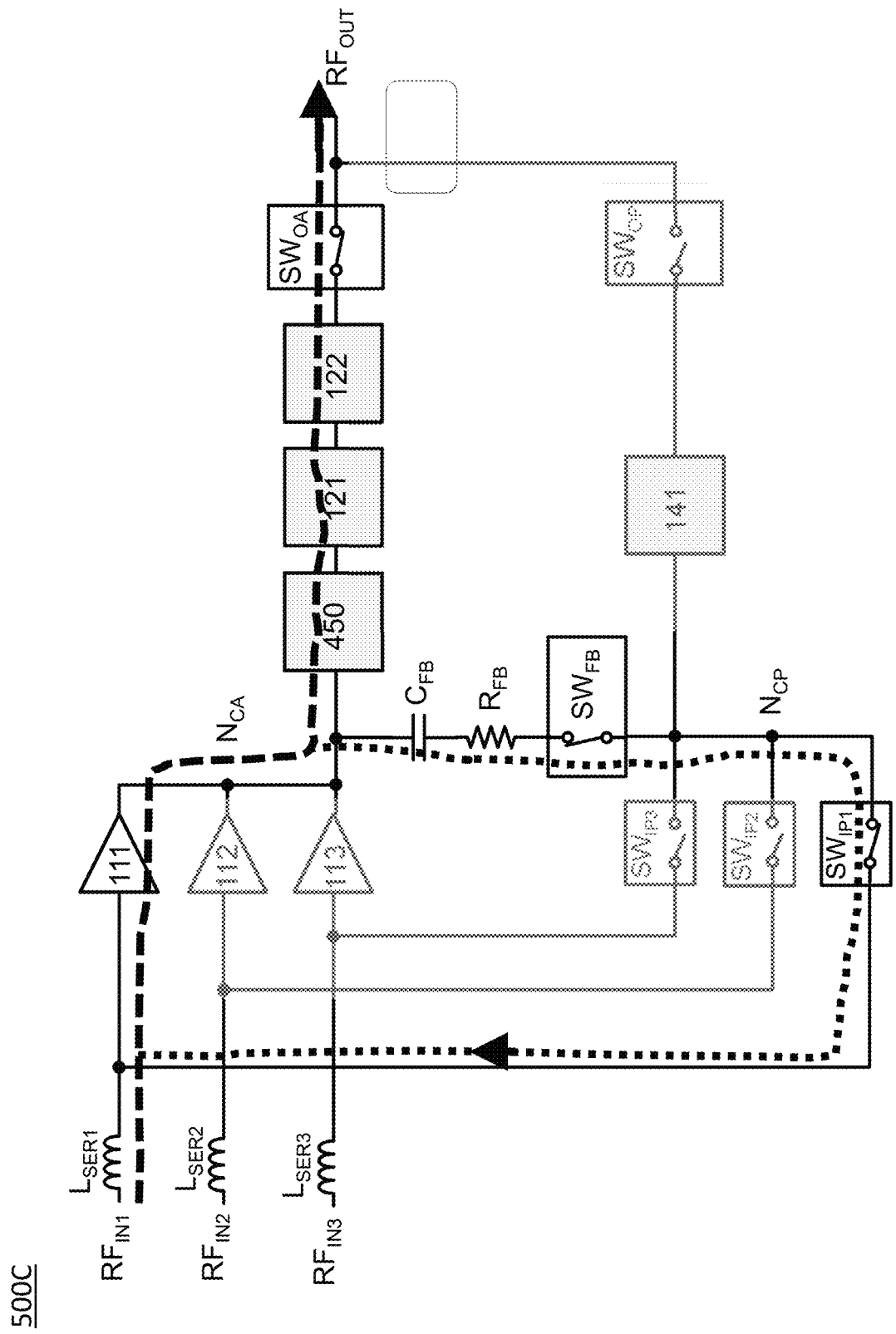
FIG. 5C shows processing of an input RF signal through a dedicated switchable passive path that is coupled to the switchable feedback path of the configuration shown in FIG. 5A.

An exemplary processing path (500C) of the input RF signal, $RF_{IN1}$, for the active attenuation mode provided by the configuration (500A) of FIG. 5A is shown in FIG. 5C. Such mode of operation may be provided by coupling of the common switchable feedback path ($SW_{FB}$, $R_{FB}$, $C_{FB}$) to a conduction path provided by the active amplification mode (e.g., conduction path shown in FIG. 5B). This includes closing of a corresponding (input) switch (e.g., $SW_{IP1}$ as shown in FIG. 1C) to couple one end of the common switchable feedback path ($SW_{FB}$, $R_{FB}$, $C_{FB}$) to an input of an activated amplifier (e.g., 111 as shown in FIG. 5C).

Figure 5D:
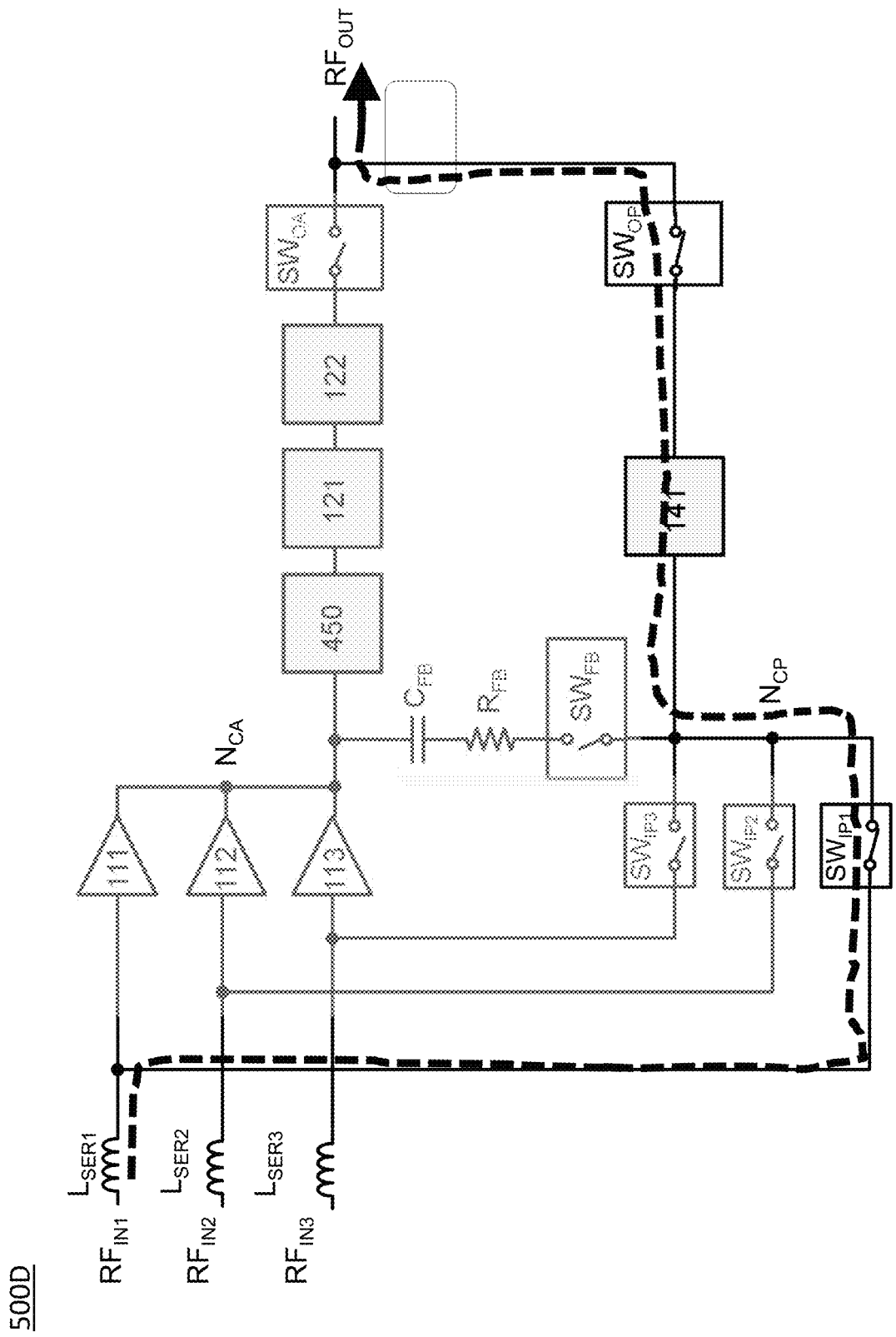
FIG. 5D shows processing of an input RF signal through the switchable passive path of the configuration shown in FIG. 5A.

An exemplary processing path (500D) of the input RF signal, $RF_{IN1}$, for the passive attenuation mode provided by the configuration (500A) of FIG. 5A is shown in FIG. 5D. In such mode of operation, the switch $SW_{IP1}$ may be turned ON to couple the input RF signal $RF_{IN1}$ for processing through the attenuator (141), and the switch $SW_{OP}$ may be turned ON to couple the attenuated RF signal to the output node (e.g., $RF_{OUT}$). All other switches, including $SW_{IP2}$, $SW_{IP3}$, SWFS and $SW_{OA}$, may be turned OFF as shown in FIG. 5D. Furthermore, amplifiers (112, 113) may be deactivated.

Figure 6:
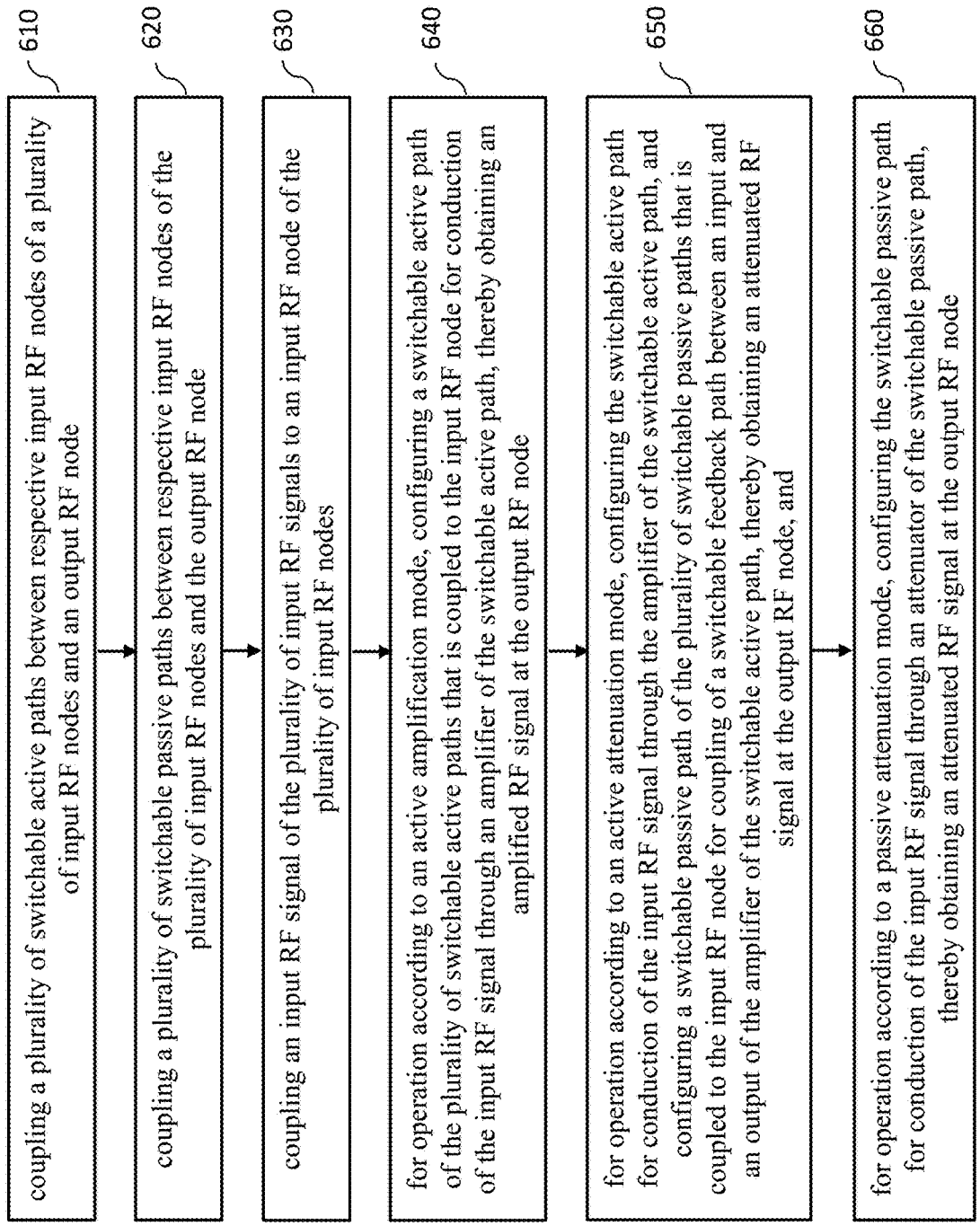
FIG. 6 is a process chart showing various steps of a method according to the present disclosure for processing a plurality of input RF signals according to multiple gain modes.

FIG. 6 is a process chart (600) showing various steps of a method according to the present disclosure for processing a plurality of input RF signals according to multiple gain modes. As shown in FIG. 6 such steps comprise: coupling a plurality of switchable active paths between respective input RF nodes of a plurality of input RF nodes and an output RF node, per step (610); coupling a plurality of switchable passive paths between respective input RF nodes of the plurality of input RF nodes and the output RF node, per step (620); coupling an input RF signal of the plurality of input RF signals to an input RF node of the plurality of input RF nodes, per step (630); for operation according to an active amplification mode, configuring a switchable active path of the plurality of switchable active paths that is coupled to the input RF node for conduction of the input RF signal through an amplifier of the switchable active path, thereby obtaining an amplified RF signal at the output RF node, per step (640); for operation according to an active attenuation mode, configuring the switchable active path for conduction of the input RF signal through the amplifier of the switchable active path, and configuring a switchable passive path of the plurality of switchable passive paths that is coupled to the input RF node for coupling of a switchable feedback path between an input and an output of the amplifier of the switchable active path, thereby obtaining an attenuated RF signal at the output RF node, per step (650); and for operation according to a passive attenuation mode, configuring the switchable passive path for conduction of the input RF signal through an attenuator of the switchable passive path, thereby obtaining an attenuated RF signal at the output RF node, per step (660).

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A multi-input multi-gain radio frequency (RF) processing circuit, comprising:
   a plurality of switchable active paths, each switchable active path of the plurality of switchable active paths coupled between a respective input RF node and an output RF node of the multi-input multi-gain RF processing circuit;
   a plurality of switchable passive paths associated to the plurality of switchable active paths, each switchable passive path of the plurality of switchable passive paths coupled between the respective input RF node and the output RF node; and
   a switchable feedback path,
   wherein
   the each switchable active path comprises:
   an amplifier comprising an amplifier input coupled to the respective input RF node, and an amplifier output coupled to a first common node that is common to the plurality of switchable active paths, and
   the each switchable passive path comprises:
   an input switch comprising an input terminal coupled to the respective input RF node, and an output terminal coupled to a second common node that is common to the plurality of switchable passive paths and to the switchable feedback path.

2. The multi-input multi-gain radio frequency (RF) processing circuit of claim 1, wherein:
   the plurality of switchable active paths comprises a first common switchable path segment coupled between the first common node and the output RF node, the first common switchable path segment comprising a common output switch of the plurality of switchable active paths that is coupled to the output RF node.

3. The multi-input multi-gain radio frequency (RF) processing circuit of claim 2, wherein:
   the first common switchable path segment further comprises at least one attenuator arranged between the first common node and the common output switch of the plurality of switchable active paths.

4. The multi-input multi-gain radio frequency (RF) processing circuit of claim 2, wherein:
   the first common switchable path segment further comprises an impedance match circuit coupled between the first common node and the at least one attenuator.

5. The multi-input multi-gain radio frequency (RF) processing circuit of claim 2, wherein:
   the common output switch of the plurality of switchable active paths is a single-pole single-throw switch.

6. The multi-input multi-gain radio frequency (RF) processing circuit of claim 2, wherein:
   the plurality of switchable passive paths comprises a second common switchable path segment coupled between the second common node and the output RF node, the second common switchable path segment comprising a common output switch of the plurality of switchable passive paths that is coupled to the output RF node.

7. The multi-input multi-gain radio frequency (RF) processing circuit of claim 6, wherein:
   the second common switchable path segment further comprises at least one attenuator arranged between the second common node and the common output switch of the plurality of switchable passive paths.

8. The multi-input multi-gain radio frequency (RF) processing circuit of claim 6, wherein:
   the common output switch of the plurality of switchable passive paths is a single-pole single-throw switch.

9. The multi-input multi-gain radio frequency (RF) processing circuit of claim 6, wherein:
the switchable feedback path is coupled between the second common node and a node that couples the at least one attenuator to the common output switch of the plurality of switchable passive paths.

10. The multi-input multi-gain radio frequency (RF) processing circuit of claim 9, wherein:
the switchable feedback path comprises a switch, a resistor and a capacitor in series connection.

11. The multi-input multi-gain radio frequency (RF) processing circuit of claim 9, wherein:
a) operation according to an active amplification mode of the multi-input multi-gain RF processing circuit comprises:
activating an amplifier of a switchable active path of the plurality of switchable active paths for amplification of an RF signal coupled to the respective input RF node;
closing the common output switch of the plurality of switchable active paths;
opening the input switch of the each switchable passive path; and
opening the common output switch of the plurality of switchable passive paths,
b) operation according to an active attenuation mode of the multi-input multi-gain RF processing circuit comprises:
activating an amplifier of a switchable active path of the plurality of switchable active paths for amplification of an RF signal coupled to the respective input RF node;
closing the common output switch of the plurality of switchable active paths;
closing the input switch of the switchable passive path coupled to the respective input RF node;
closing a switch of the switchable feedback path; and
closing the common output switch of the plurality of switchable passive paths, and
c) operation according to a passive attenuation mode of the multi-input multi-gain RF processing circuit comprises:
closing an input switch of a switchable passive path of the plurality of switchable passive paths for attenuation of an RF signal coupled to the respective input RF node;
closing the common output switch of the plurality of switchable passive paths;
deactivating the amplifier of the each switchable active path of the plurality of switchable active paths; and
opening the common output switch of the plurality of switchable active paths.

12. The multi-input multi-gain radio frequency (RF) processing circuit of claim 6, wherein:
the switchable feedback path is coupled between the second common node and the first common node.

13. The multi-input multi-gain radio frequency (RF) processing circuit of claim 12, wherein:
the switchable feedback path comprises a switch, a resistor and a capacitor in series connection.

14. The multi-input multi-gain radio frequency (RF) processing circuit of claim 12, wherein:
a) operation according to an active amplification mode of the multi-input multi-gain RF processing circuit comprises:
activating an amplifier of a switchable active path of the plurality of switchable active paths for amplification of an RF signal coupled to the respective input RF node;
closing the common output switch of the plurality of switchable active paths;
opening the input switch of the each switchable passive path; and
opening the common output switch of the plurality of switchable passive paths,
b) operation according to an active attenuation mode of the multi-input multi-gain RF processing circuit comprises:
activating an amplifier of a switchable active path of the plurality of switchable active paths for amplification of an RF signal coupled to the respective input RF node;
closing the common output switch of the plurality of switchable active paths;
closing the input switch of the switchable passive path coupled to the respective input RF node;
closing a switch of the switchable feedback path; and
opening the common output switch of the plurality of switchable passive paths, and
c) operation according to a passive attenuation mode of the multi-input multi-gain RF processing circuit comprises:
closing an input switch of a switchable passive path of the plurality of switchable passive paths for attenuation of an RF signal coupled to the respective input RF node;
closing the common output switch of the plurality of switchable passive paths;
opening the switch of the switchable feedback path;
deactivating the amplifier of the each switchable active path of the plurality of switchable active paths; and
opening the common output switch of the plurality of switchable active paths.

15. The multi-input multi-gain radio frequency (RF) processing circuit of claim 1, wherein:
the amplifier of the each switchable active path is a low noise amplifier (LNA).

16. The multi-input multi-gain radio frequency (RF) processing circuit of claim 15, wherein:
the LNA comprises metal-oxide-semiconductor (MOS) field effect transistors (FETs), or complementary metal-oxide-semiconductor (CMOS) field effect transistors (FETs).

17. The multi-input multi-gain radio frequency (RF) processing circuit of claim 16, wherein:
said transistors are fabricated using one of: a) silicon-on-insulator (SOI) technology, and b) silicon-on-sapphire technology (SOS).

18. An electronic module comprising the multi-input multi-gain radio frequency (RF) processing circuit of claim 1.

19. A method, comprising using the electronic module of claim 18 in one or more electronic systems comprising: a) a television, b) a cellular telephone, c) a personal computer, d) a workstation, e) a radio, f) a video player, g) an audio player, h) a vehicle, i) a medical device, and j) other electronic systems.

20. A multi-input multi-gain radio frequency (RF) processing circuit, comprising:
a plurality of switchable active paths comprising respective one or more switches, each switchable active path of the plurality of switchable active paths coupled between a respective input RF node of a plurality of input RF nodes and an output RF node of the multi-input multi-gain RF processing circuit;

a plurality of switchable passive paths comprising respective one or more switches, each switchable passive path of the plurality of switchable passive paths coupled between a respective input RF node of the plurality of input RF nodes and the output RF node; and a switchable feedback path, wherein during a passive attenuation mode of operation of the multi-input multi-gain RF processing circuit, the respective one or more switches of a switchable active path of the plurality of switchable active paths are configured to provide a conduction path of an RF signal coupled to the respective input RF node to the output RF node through said switchable active path, the conduction path comprising an amplifier, and the respective one or more switches of a switchable passive path of the plurality of switchable passive paths are configured to couple the switchable feedback path to said conduction path to provide a feedback conduction path between an output and an input of the amplifier.

21. The multi-input multi-gain radio frequency (RF) processing circuit of claim 20, wherein:

during an active amplification mode of operation of the multi-input multi-gain RF processing circuit, the respective one or more switches of the switchable active path are configured to provide the conduction path of the RF signal through said switchable active path, and the respective one or more switches of the plurality of switchable passive paths are configured to decouple the RF signal from respective conduction paths of the plurality of switchable passive paths, and during a passive attenuation mode of operation of the multi-input multi-gain RF processing circuit, the respective one or more switches of the switchable passive path are configured to provide a conduction path of the RF signal through said switchable passive path, the conduction path comprising an attenuator, and the respective one or more switches of the plurality of switchable active paths and deactivated states of respective amplifiers of the plurality of switchable active paths are configured to decouple the RF signal from respective conduction paths of the plurality of switchable active paths.

* * * * *